United States Patent [19]

Honjo

[11] Patent Number: 4,779,127
[45] Date of Patent: Oct. 18, 1988

[54] THREE-DIMENSIONAL INTEGRATED CIRCUIT

[75] Inventor: Kazuhiko Honjo, Tokyo, Japan

[73] Assignee: NEC Corporation, Japan

[21] Appl. No.: 882,676

[22] Filed: Jul. 7, 1986

[30] Foreign Application Priority Data

Jul. 11, 1985 [JP] Japan .................................. 60-152902

[51] Int. Cl.[4] ..................... H01L 27/02; H01L 29/12; H01L 29/80
[52] U.S. Cl. ......................................... 357/41; 357/22; 357/47; 357/49; 357/50; 357/58; 307/450
[58] Field of Search ............... 357/47, 22 R, 49, 22 F, 357/50, 58, 41; 307/450

[56] References Cited

U.S. PATENT DOCUMENTS 4,351,099 9/1982 Tagaki et al. ..................... 357/22 R
4,490,632 12/1984 Everett et al. ....................... 307/450

FOREIGN PATENT DOCUMENTS 0193842 10/1986 European Pat. Off. .............. 357/41
57-89260 6/1982 Japan ..................................... 357/41
58-68963 4/1983 Japan ..................................... 357/49
59-63753 4/1984 Japan ..................................... 357/47

OTHER PUBLICATIONS

*Elect. Comm. Soc. Papers*, vol. 66, No. 8, pp. 831–834, Aug. 1983.
*IEEE Elect. Dev. Lettrs.*, vol. EDL-5, No. 11, Nov. 1984, "Folded Gate–A Novel Logic Gate Structure", Shur.
*IEEE GaAs IC Symposium Digests*, 1984, pp. 121–124, Ishii et al., "Processing ... LSIs".

Primary Examiner—Andrew J. James
Assistant Examiner—Jerome Jackson
Attorney, Agent, or Firm—Laff, Whitesel, Conte & Saret

[57] ABSTRACT

In order to minimize the interconnections, there is provided a three-dimensional integrated circuit fabricated on a semi-insulating substrate of compound semiconductor material comprising a first compound semiconductor layer formed on the surface of the semi-insulating substrate and electrically connected to a variable voltage source, a second compound semiconductor layer formed on the surface of the first compound semiconductor layer opposite in conductivity type thereto and providing an electric device together with the first compound semiconductor layer, an undoped compound semiconductor layer epitaxially grown on the surface of the second compound semiconductor layer and formed with a plurality of doped regions for providing interconnections of the three dimensional integrated circuit, one of the interconnections providing an electric connections to the electric device formed with the first and second compound semiconductor layers, a doped compound semiconductor layer formed on the surface of the undoped compound semiconductor layer and capable of providing a current path established therein, and a conductive layer formed on the surface of the doped compound semiconductor layer and providing a gate to control the current path in the doped compound semiconductor layer, the conductive layer and the doped compound semiconductor layer forming parts of a field effect transistor which in turn forms parts of the three-dimensional integrated circuit together with the electric device.

10 Claims, 4 Drawing Sheets

THREE-DIMENSIONAL INTEGRATED CIRCUIT

FIELD OF THE INVENTION

The present invention relates to a three-dimensional integraged circuit and, more particularly, to a three-dimensional integrated circuit fabricated on a semi-insulating substrate of compound semiconductor material

BACKGROUND OF THE INVENTION

There is now an increasing interest in the semiconductor industry in high speed devices. A compound semiconductor material such as, for example, gallium-arsenide has an electron mobility about five times greater than that of monocrystalline silicon which is now widely applied to various integrated circuits. For this reason, research and development efforts have been continued to fabricate an integrated circuit on a substrate of compound semiconductor material. One of the fruits of the research and development efforts is disclosed in IEEE Ga-As IC Symposium Digests, 1984, pp. 121 to 124, in which memory circuits are realized on a gallium-arsenide substrate measuring 7.2 millimeters×6.2 millimeters. Prior arts related are also disclosed in IEEE ELECTRON DEVICE LETTERS, VOL. EDL-5, NO. 11, pp. 454 to 455, November 1984, and in ELECTRONIC COMMUNICATION SOCIETY PAPERS, VOL. 66, NO. 8, pp. 831 to 834, August 1983, respectively.

In the semiconductor industry, there is a soaring requirement to increase the number of transistors fabricated on a single semiconductor chip. One of the solutions is to use a chip having a large chip size. The memory device disclosed in the above paper has 16 K-bit memory cells on the gallium-arsenide substrate measuring 7.2 millimeters×6.2 millimeters. The maximum chip size is generally limited to 10 millimeters×10 millimeters in consideration of production yield so that it is necessary to have another solution to fabricate more than 64K-bit memory cells on a single gallium-arsenide semiconductor substrate.

Compound semiconductor substrates provide ease of fabrication for three dimensional integrated circuit because compound semiconductor layers are sequentially grown by suitable epitaxial techniques and then it is relatively easy to form miltilayer structures with channel layers insulated from each other. For this reason, a three-dimensional integrated circuit fabricated in a multilayer structure is another solution to increase the number of transistors without increasing a chip size.

A known example of a three-dimensional integrated circuit fabricated on a compound semiconductor material is illustrated in FIG. 1. A semi-insulating substrate 1 is prepared from a bulk wafer of gallium-arsenide. On the surface of the semi-insulating substrate 1 is epitaxially grown an n-type gallium-arsenide compound semiconductor layer 2 which in turn is covered with an undoped gallium-arsenide semiconductor layer 3. An n-type gallium-arsenide semiconductor layer 4 is epitaxially grown on the surface of the resultant structure. The undoped gallium-arsenide semiconductor layer is also grown by an usual epitaxial process and is partially removed by suitable etching techniques to expose selected portions of the surface of the n-type gallium-arsenide semiconductor layer 2 one of which is shown in FIG. 1. On the exposed portions of the gallium-arsenide semiconductor layer 2 as well as the selected portions of the gallium-arsenide semiconductor layer 4 is deposited a metal layer which is capable of providing a Schottky barrier therebetween. The metal layer is patterned and etched to form a plurality of gates 5 and 6 for field effect transistors forming parts of the integrated circuit. The gates 5 and 6 formed on the respective gallium-arsenide semiconductor layers 4 and 2 control depletion layers 7 and 8 extending into the surface portions of the gallium-arsenide semiconductor layers 4 and 2, respectively, and cause the currents flowing thereunder to vary in accordance with the control voltage applied to the gates 5 and 6.

The known three-dimensional integrated circuit has a drawback in that the field effect transistor formed with the gate 6 can not be disposed underneath the field effect transistor having the gate 5. This limits the number of the field effect transistors fabricated on the substrate 1. Further, the field effect transistors are alternately arranged on the gallium-arsenide semiconductor layers 2 and 4, then a wiring metal interconnecting the field effect transistors, such as two transistors shown in FIG. 1, tends to be elongated and, for this reason, signals on the wiring metal are delayed due to large parasitic capacitance applied to the wiring metal.

This invention contemplates elimination of these drawbacks inherent in the conventional three-dimensional integrated circuit fabricated on a compound semiconductor substrate.

SUMMARY OF THE INVENTION

In accordance with the present invention, there is provided a three-dimensional integrated circuit fabricated on a semi-insulating substrate compound semiconductor material comprising (1) a first compound semiconductor layer formed on the surface of the semi-insulating substrate and electrically connected to a variable voltage source, (2) a second compound semiconductor layer formed on the surface of the first compound semiconductor layer opposite in conductivity type thereto and providing an electric device together with the first compound semiconductor layer, (3) an undoped compound semiconductor layer epitaxially grown on the surface of the second compound semiconductor layer and formed with a plurality of doped regions for providing interconnections of the three dimensional integrated circuit, one of the interconnections providing an electric connections to the electric device formed with the first and second compound semiconductor layers, (4) a doped compound semiconductor layer formed on the surface of the undoped compound semiconductor layer and capable of providing a current path established therein, and (5) a conductive layer formed on the surface of the doped compound semiconductor layer and providing a gate to control the current path in the doped compound semiconductor layer, the conductive layer and the doped compound semiconductor layer forming parts of a field effect transistor which in turn forms parts of the three-dimensional integrated circuit together with the electric device.

BRIEF DESCRIPTION OF THE DRAWINGS

The features and advantages of a three-dimensional integrated circuit according to the present invention will be more clearly understood from the accompanying drawings in which.

DESCRIPTION OF THE PREFERRED EMBODIMENTS

Figure 1:
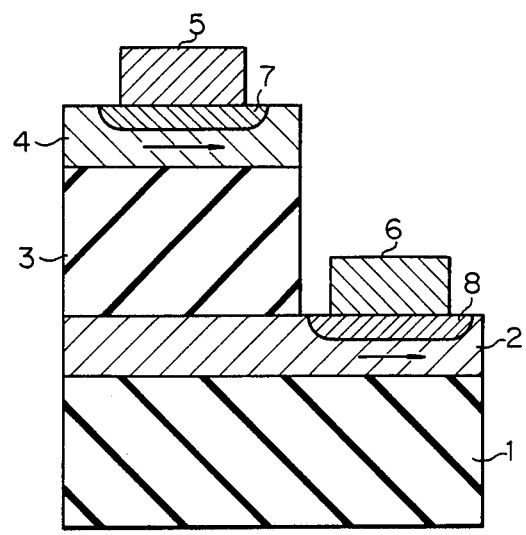
FIG. 1 is a fragmentary cross sectional view showing a typical example of a known three-dimensional integrated circuit.
Figure 2:
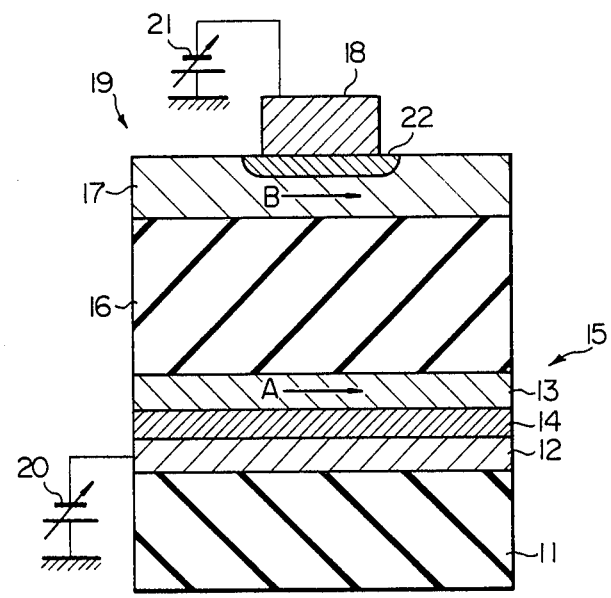
FIG. 2 is a fragmentary cross sectional view showing a part of a first preferred embodiment of a three-dimensional integrated circuit according to the present invention.

Referring to FIG. 2 of the drawings, there is shown a part of a first embodiment of a three-dimensional integrated circuit which comprises a semi-insulating substrate of gallium-arsenide, typically, made from a bulk wafer. On the substrate 11 is epitaxially grown a p-type gallium-arsenide semiconductor layer 12 which in turn is covered with an n-type gallium-arsenide semiconductor layer 13 formed by an epitaxial process and capable of providing a current path indicated by an arrow A. When the N-type gallium-arsenide semiconductor layer 13 overlies the p-type gallium-arsenide semiconductor layer 12, a depletion layer 14 takes place and extends from the junction therebetween into both gallium-arsenide semiconductor layers 12 and 13 of different conductivity types. The depletion layer 14 thus formed therebetween electrically separates the p-type gallium-arsenide semicoductor layer 12 from the n-type gallium-arsenide semiconductor layer 13 and serves as a gate insulating layer which forms parts of a field effect transistor 15 together with the gallium-arsenide semiconductor layers 12 and 13.

On the n-type gallium-arsenide semiconductor layer 13 is further epitaxially grown an undoped gallium-arsenide semiconductor layer 16 which provides the field effect transistor 15 with a suitable insulation. An n-type gallium-arsenide semiconductor layer 17 is epitaxially grown on the undoped gallium-arsenide semiconductor layer 16 and capable of providing a current path indicated by an arrow B. On the n-type gallium-arsenide semiconductor substrate 17 is deposited a metal layer of aluminum which is then patterned and etched to form a gate 18 forming parts of another field effect transistor 19 together with the n-type gallium-arsenide semiconductor layer 17. In this instance, the gate 18 is formed of aluminum, however another conductive material such as, for example, a p-type gallium-arsenide semiconductor layer is available. The field effect transistors 15 and 19 in turn form parts of a three-dimensional integrated circuit together with a plurality of electric elements including another field effect transistor and interconnections (not shown). Though not shown in FIG. 2, the field effect transistor 15 is electrically connected to the field effect transistor 19 through a doped region formed in the undoped gallium-arsenide semiconductor layer 16 extending in a direction of the thickness of the layer 16. In order to form the gallium-arsenide semiconductor layers 12, 13, 16 and 17, suitable epitaxial techniques such as MBE growth (molecular beam epitaxy) or MOCVD (metal-organic chemical vapor deposition) are used.

As will be clearly understood from the FIG. 2, the field effect transistor 15 is arranged to be disposed just underneath the field effect transistor 19 and, for this reason, the doped region interconnecting the transistors 15 and 19 is reduced to the minimum length, thereby propagating signals from the field effect transistor 19 to the field effect transistor 15 without substantial delay. Moreover, all the surface portions of the semi-insulating substrate 11 is available to form the electric elements including the field effect transistor 15 even if the surface portions are disposed underneath the electric elements formed on the undoped gallium-arsenide semiconductor layer 16.

Functions of the field effect transistors 15 and 19 are described hereinunder. Assuming now that the p-type gallium-arsenide semiconductor layer 12 is supplied from a variable voltage source 20 with a control signal. The extension of the depletion layer 14 is controlled by the p-type gallium-arsenide semiconductor layer 12 in accordance with the magnitude of the control signal. The thickness (Vt$_1$) of the depletion layer 14 is given by Equation (1).

$$D_1(Vt_1) = \sqrt{2 \epsilon s(Na + Nd) \cdot (Vbi - Vt_1)/q(Na \cdot Nd)} \quad (1)$$

where $\epsilon s$ is the dielectric constant of the depletion layer 14, q is the magnitude of the electron charge, Na and Nd are the acceptor impurity density and the doner impurity density, respectively, Vbi is the builtin potential of the gallium-arsenide of about 1.3 V. and Vt$_1$ is the magnitude of the control voltage. If the thickness D$_1$(Vt$_1$) of the depletion layer 14 is calculated from Equation (1), the current I$_1$(Vt$_1$) is given by Equation (2).

$$I_1(Vt_1) = \{d_1 - D_1(Vt_1)\} n \cdot q \cdot v \cdot w \quad (2)$$

where d$_1$ is the thickness of the n-type gallium-arsenide semiconductor layer 13, n is the density of free carrier, v is the drift velocity and w is the width of the electric path. As will be understood from Equations (1) and (2), when the magnitude of the control voltage Vt$_1$ is varried, the thickness D$_1$(Vt$_1$) is then increased in accordance therewith, thereby decreasing the current I$_1$(Vt$_1$).

The function of the field effect transistor 19 is also described on the assumption that the gate 18 is supplied from a variable voltage source 21 with a control signal. The thickness D$_2$(Vt$_2$) of the depletion layer 22 is given by Equation (3).

$$D_2(Vt_2) = \sqrt{2 \epsilon s(Vbi - Vt_2 - kT/q)/q(Na \cdot Nd)} \quad (3)$$

where kT is the thermal energy and Vbi is about 0.75 V. When the thickness D$_2$(Vt$_2$) of the depletion layer 22 is calculated from Equation (1), the current I$_2$(Vt$_2$) is given by Equation (4).

$$I_2(Vt_2) = \{d_2 - D_2(Vt_2)\} n \cdot q \cdot v \cdot w \quad (4)$$

where d$_2$ is the thickness of the n-type gallium-arsenide semiconductor layer 17. As will be understood from Equations (3) and (4), if the magnitude of the control voltage Vt$_2$ is varried, the thickness D$_2$(Vt$_2$) is then increased in accordance therewith, thereby decreasing the current $I_2(Vt_2)$ in the similar manner.

The field effect transistors 15 and 19 are thus responsible to the control signals supplied from the variable voltage sources 20 and 21, when the field effect transistors 15 and 19 are integrated to form a three dimensional circuit, the currents $I_1(Vt_1)$ and $I_2(Vt_2)$ are controlled by the p-type gallium-arsenide semiconductor layer 12 and the gate 18 supplied with control signals from electric elements instead of the variable voltage supplies 20 and 21, respectively.

Figure 3:
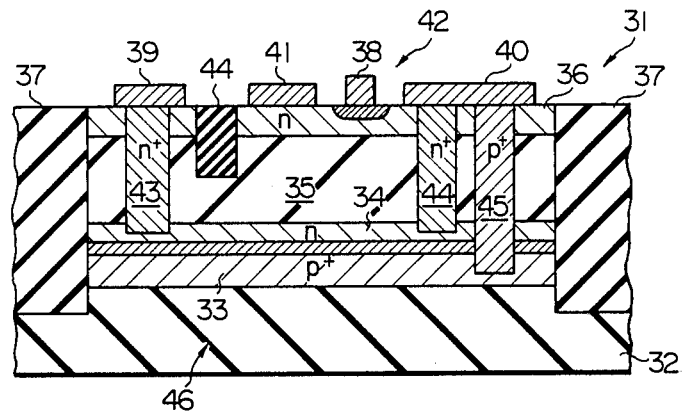
FIG. 3 is a sectional view showing a part of an example of interconnections of the the first preferred embodiment of the three-dimensional integrated circuit.
Figure 4:
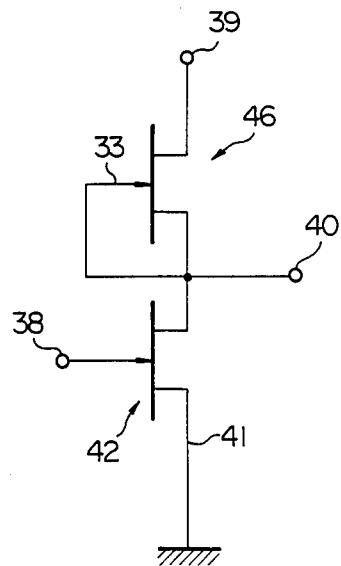
FIG. 4 is a circuit diagram showing the three-dimensional integrated circuit illustrated in FIG. 3.

Turning to FIG. 3, there is shown an interconnections of a three dimensional circuit employing the field effect transistors 15 and 19. In this instance, a multilayer structure 31 comprises a semi-insulating substrate 32 of gallium-arsenide, a p-type gallium-arsenide semiconductor layer 33, an n-type gallium-arsenide semiconductor layer 34, an undoped gallium-arsenide semiconductor layer 35 and an n-type gallium-arsenide semiconductor layer 36. In this instance, the undoped gallium-arsenide semiconductor layer 35 measures from about 1000 angstroms to about 10000 angstroms. In the multilayer structure 31 are formed isolation regions to define active regions in which electric elements including field effect transistors are fabricated, respectively. In FIG. 3 are shown two of the active regions which are defined by the isolation region 37. The isolation region 37 passes through the semiconductor layer 36 35, 34 and 33 and reaches the semi-insulating substrate 32 so that the two active regions are defined on the undoped gallium-arsenide semiconductor layer 35 and the semi-insulating substrate 32, respectively. On the n-type gallium-arsenide semiconductor layer 36 are patterned metal layers 38, 39, 40 and 41. The layer 38 is made of aluminum,and the layers 39, 40 and 41 are made of gold-germanium. The metal layer 38 serves as a Schottky gate of a field effect transistor 42 which functions on the principle described in connection with the field effect transistor 19 illustrated in FIG. 2, so that a current passing under the gate 38 is controlled by the magnitude of the voltage applied to the conductive layer 38. The undoped gallium-arsenide semiconductor region 35 are formed with a doped region 43 which is separated from the portion providing the current path of the field effect transistor 42 by an isolation region 44 terminated in the layer 35. The doped region 43 is exposed to the surface of the n-type gallium-arsenide semiconductor layer 36 at one end thereof and reaches the n-type gallium-arsenide semiconductor layer 34 at the other end thereof. The doped region 43 contacts the metal layer 39 which in turn is electrically connected to a suitable voltage source to supply the n-type gallium-arsenide semiconductor layer 34 with a drain voltage. The undoped gallium-arsenide semiconductor layer 35 is further formed with doped regions 44 and 45 the former of which provides an interconnection between the n-type gallium-arsenide semiconductor layer 34 and the metal layer 40 and the latter of which provides an interconnection between the metal layer 40 and the p-type gallium-arsenide semiconductor layer 33. The p-type and n-type gallium-arsenide semiconductor layers 33 and 34 thus electrically connected form in combination a load transistor 46 which has the same structure of the field effect transistor 15 illustrated in FIG. 2. The doped region 44 passes through the n-type gallium-arsenide semiconductor layer 36, so that a current path is established between the n-type gallium-arsenide semiconductor layers 34 and 36. The metal layer 38 controls the current from the doped region 44 to the metal layer 41 electrically connected to the ground based on an input signal applied thereto as described hereinbefore, then the voltage level on the metal layer 40 is shifted between logic "0" level and logic "1" level depending upon the voltage level on the metal layer 38, thereby providing a direct coupled FET logic gate operation. The equivalent circuit realized by in the structure shown in FIG. 3 is illustrated in FIG. 4 in which like reference numerals designate corresponding parts in FIG. 3.

Figure 5:
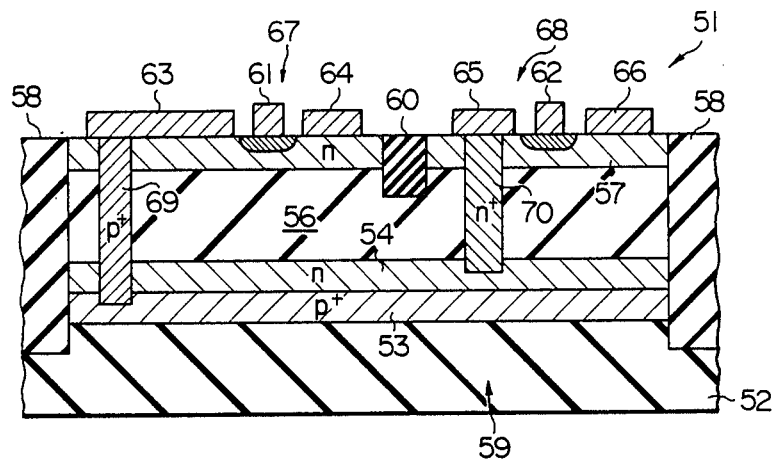
FIG. 5 is a sectional view showing a part of an example of interconnections employed in a second preferred embodiment according to the present invention.
Figure 6:
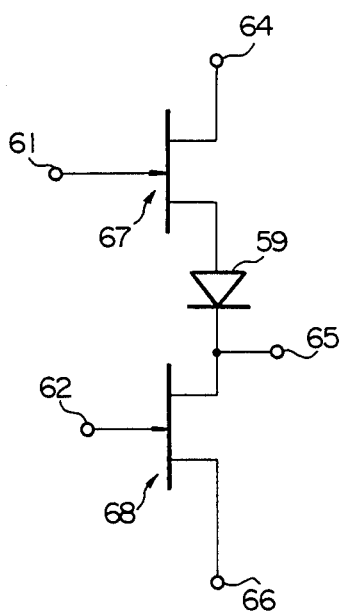
FIG. 6 is a circuit diagram showing the three-dimensional integrated circuit illustrated in FIG. 5.

FIG. 5 shows an example of interconnections of a second preferred embodiment of a three-dimensional integrated circuit 51 according to the present invention. The three-dimensional circuit 51 is realized on a semi-insulating substrate 52 of gallium-arsenide. A p-type gallium-arsenide semiconductor layer 53 and an n-type gallium-arsenide semiconductor layer 54 are grown in succession on the semi-insulating substrate 52 to form a junction. On the n-type gallium-arsenide semiconductor layer 54 is epitaxially grown an undoped gallium-arsenide semiconductor layer 56 which measures from about 1000 angstroms to about 10000 angstroms. An n-type gallium- arsenide semiconductor layer 57 overlies the undoped gallium-arsenide semiconductor layer 56 to fabricate a multilayer structure having the n-type gallium-arsenide semiconductor layers 54 and 57 sandwitching the undoped gallium-arsenide semiconductor layer 56. The multilayer structure is formed with isolation regions to define active regions on both semi-insulating substrate 52 and undoped gallium-arsenide semiconductor layer 56. Namely, an isolation region 58 passing through the semiconductor layers 57, 56, 54 and 53 resches the semi-insulating substrate 52 and partitions the semi-insulating substrate 52 to form an active region serving as a level shift diode 59. Further, an isolation region 60 passes through the n-type gallium-arsenide semiconductor layer 57 and reaches the undoped gallium-arsenide semiconductor layer 56 to partition the n-type gallium-arsenide semiconductor layer 57 into a plurality of active regions together with the other isolation regions including the region 58. On the entire surface of the n-type gallium-arsenide semiconductor layer is deposited a metal layer which is patterned and etched to form conductive layers 60, 61, 62, 63, 64 and 65. The conductive layer 61 serves as a Schottky gate of a field effect transistor 67 formed in one of the aforesaid active regions and the conductive layer 62 provides a Schottky gate of another field effect transistor 68 formed in another active region isolated from the active region having the transistor 67. The conductive layer 64 is electrically connected to a positive voltage source (not shown) and supplies the active region with a current. The field effect transistor 67 functions on the principle described in connection with the field effect transistor 19 illustrated in FIG. 2, so that the current flowing under the gate 61 is controlled by the magnitude of the voltage on the conductive layer 61. The undoped gallium-arsenide semiconductor layer 56 is formed with doped regions 69 and 70 which downwardly extend from the conductive layers 63 and 65 to the p-type and n-type gallium-arsenide semiconductor layers 53 and 54, respectively. The conductive layer 63 thus electrically connected to the p-type gallium-arsenide semiconductor layer 53 supplies the level shift diode 59 with the current controlled by the field effect transistor 67. The diode 59 produces a predetermined level shift and transfers the current to the field effect transistor 68 through the doped region 70. The field effect transistor 68 also functions on the principle described in connection with the field effect transistor 19 shown in FIG. 2, so that the current flows from the conductive layer 65 to the conductive layer 66 electrically connected to a negative voltage source (not shown) under the controlling of the gate 62 to which a control signal is applied. The field effect transistors 67 and 68 and the level shift diode 59 form in combination a buffer amplifier shown in FIG. 6 in which like reference numerals designate corresponding parts used in FIG. 5.

The three-dimensional integrated circuits illustrated in FIGS. 3 and 5 have the conductive layers of aluminum, however the conductive layers 38 to 41 and 61 to 66 may be of another metal which provides a Schottky barrier together with the n-type gallium arsenide semiconductor layers 36 and 57. Further, p-type gallium-arsenide semiconductor is available to form those conductive layers. It is also possible to fabricate the three dimensional integrated circuit on the substrate of indium-phosphide, aluminum gallium-arsenide or indium-gallium-arsenide.

As will be understood from the foregoing description, the three-dimensional integrated circuits according to the present invention are advantageous in that the lower semiconductor layer is available to form electric elements even if some of the electric elements are disposed underneath the electric elements in the upper semiconductor layer, then minimizing the interconnections between the upper and lower semiconductor layers. This minimized interconnections are conductive to reduction in capacitance of parasitic capacitor and, for this reason, propagate signals without any serious delay. In addition, the field effect transistors can drive a relatively large load by virtue of the reduced parasitic capacitance. In this aspect, the field effect transistor such as 42 or 67 shares in the benefit of reduced parasitic capacitance.

What is claimed is:

1. A three-dimensional integrated circuit fabricated on a semi-insulating substrate of compound semiconductor material, comprising:
    a first compound semiconductor layer formed on the surface of the semi-insulating substrate and electrically connected to a variable voltage source;
    a second compound semiconductor layer formed on the surface of the first compound semiconductor layer opposite in conductivity type thereto and providing an electric device together with the first compound semiconductor layer;
    an undoped compound semiconductor layer epitaxially grown on the surface of the second compound semiconductor layer and formed with a plurality of doped regions for providing interconnections of the three dimensional integrated circuit, one of the interconnections providing an electric connection to the electric device formed with the first and second compound semiconductor layers;
    a doped compound semiconductor layer formed on the surface of the undoped compound semiconductor layer and capable of providing a current path established therein; and
    a conductive layer formed on the surface of the doped compound semiconductor layer and providing a gate to control the current path in the doped compound semiconductor layer, the conductive layer and the doped compound semiconductor layer forming parts of a field effect transistor which in turn forms parts of the three-dimensional integrated circuit together with the electric device.

2. A three-dimensional integrated circuit as set forth in claim 1, wherein the first compound semiconductor layer is electrically separated from the second compound semiconductor layer by a depletion layer extending from the junction therebetween to the first and second compound semiconductor layers and controls a current path established in the second compound semiconductor layer based on the magnitude of a voltage applied thereto.

3. A three-dimensional integrated circuit as set forth in claim 2, wherein the interconnections provide a first electrical connection supplying the second compound semiconductor layer wtih a first constant voltage level, a second electrical connection interconnecting the second compound semiconductor layer and the field effect transistor formed with the doped compound semiconductor layer and the conductive layer and a third electric connection interconnecting the second electric connection and the first compound semiconductor layer, thereby forming a load device connected to the field effect transistor.

4. A three-dimensional integrated circuit as set forth in claim 1, wherein the first and second compound semiconductor layers provide a pn junction serving as a diode.

5. A three-dimensional integrated circuit as set forth in claim 4, wherein the interconnections provide a first electric connection to the first compound semiconductor layer and a second electric connection to the second compound semiconductor layer.

6. A three-dimensional integrated circuit as set forth in claim 1, wherein the conductive layer and the doped compound semiconductor layer provides a schottky barrier contact.

7. A three-dimensional integrated circuit as set forth in claim 1, wherein the compound semiconductor material is selected from the group of gallium-arsenide, indium-phosphide, aluminum-gallium-arsenide and indium-gallium-arsenide.

8. A multi-layered compound semiconductor integrated circuit fabricated on a semi-insulating substrate of compound semiconductor material, comprising:
    multi-layered structure provided on on the semi-insulating substrate and consisting of at least a first semiconductor layer of one conductivity type, a second semiconductor layer of the other conductivity type and an undoped semiconductor layer;
    a third semiconductor layer of the other conductivity type provided on the surface of the undoped semiconductor layer;
    a first electrode electrically connected to the first semiconductor layer of one conductivity type to provide a first bias voltage which is operative to control electrons flowing in the second semiconductor layer of the other conductivity type; and
    a second electrode formed on the surface of the third semiconductor layer of the other conductivity type and supplied with a second bias voltage to control electrons flowing in the third semconductor layer.

9. A three-dimensional integrated circuit fabricated on a semi-insulating substrate of compound semiconductor material, comprising:
    a load transistor having a p-type compound semiconductor layer formed on the semi-insulating substrate and an n-type first compound semiconductor layer formed on the p-type compound semiconductor layer;

an insulating layer of undoped compound semiconductor material formed on the n-type first compound semiconductor layer;

a gate transistor having an n-type second compound semiconductor layer formed on the insulating layer and electrically connected to the ground voltage, and a conductive layer formed on the n-type second compound semiconductor layer and serving as a gate electrode to which an input voltage is applied;

an n-type first compound semiconductor region extending from the upper surface of the n-type second compound semiconductor layer through the n-type second compound semiconductor layer and the insulating layer to the n-type first compound semiconductor layer to supply the n-type first compound semiconductor layer with a positive voltage;

an n-type second compound semiconductor region extending from the n-type first compound semiconductor layer through the insulating layer and the n-type second compound semiconductor layer to the upper surface of the n-type compound semiconductor layer;

a p-type compound semiconductor region extending from the p-type compound semiconductor layer through the n-type first compound semiconductor layer, the insulating layer and the n-type second compound semiconductor layer to the upper surface of the n-type second compound semiconductor layer, the p-type compound semiconductor region and the n-type second compound semiconductor region being operative to provide interconnections between the p-type compound semiconductor layer and the n-type first and second compound semiconductor layers together with a conductive layer formed on the upper surface of the n-type second compound semiconductor layer; and an isolating region provided between the gate transistor and the n-type first compound semiconductor region and extending from the upper surface of the n-type second compound semiconductor region to the insulating layer.

10. A three-dimensional integrated circuit fabricated on a semi-insulating substrate of compound semiconductor material, comprising:

a diode having a p-type compound semiconductor layer formed on the semi-insulating substrate and an n-type first compound semiconductor layer formed on the p-type compound semiconductor layer;

an insulating layer of undoped compound semiconductor material formed on the n-type first compound semiconductor layer;

a first field effect transistor having a first portion of an n-type second compound semiconductor layer formed on the insulating layer and electrically connected to a positive drain voltage and a conductive layer formed on the first portion and serving as a gate electrode to which an input voltage is applied;

a second field effect transistor having a second portion of the n-type second compound semiconductor layer and a conductive layer formed on the second portion and serving as a gate electrode to which a control voltage is applied to control a current passing through the second field effect transistor;

a p-type compound semiconductor region extending from the upper surface of the first portion of the n-type second compound semiconductor layer through the first portion, the insulating layer and the n-type first compound semiconductor layer to the p-type compound semiconductor layer to provide an electric path between the first field effect transistor and the diode together with a conductive layer formed on the upper surface of the first portion and electrically separated from the conductive layer serving as the gate electrode of the first field effect transistor;

an n-type compound semiconductor region extending from the n-type first compound semiconductor layer through the insulating layer and the second portion of the n-type second compound semiconductor layer to the upper surface of the second portion of the n-type second compound semiconductor layer to provide an electric path between the diode and the second field effect transistor;

an isolating region provided between the first and second field effect transistors and extending from the upper surface of the n-type second compound semiconductor region to the insulating layer;

a conductive layer formed on the upper surface of the second portion to serve as an output node and electrically connected to the n-type compound semiconductor region; and a conductive layer formed on the upper surface of the second portion to supply a negative source voltage and located at the opposite side to the conductive layer serving as the output node with respect to the conductive layer serving as the gate electrode of the second field effect transistor.

* * * * *